United States Patent [19]

Sumi

[11] Patent Number: 5,254,498
[45] Date of Patent: Oct. 19, 1993

[54] METHOD FOR FORMING BARRIER METAL STRUCTURE

[75] Inventor: Hirofumi Sumi, Kanagawa, Japan

[73] Assignee: Sony Corporation, Tokyo, Japan

[21] Appl. No.: 886,092

[22] Filed: May 21, 1992

[30] Foreign Application Priority Data

May 23, 1991 [JP] Japan ................. 3-149892

[51] Int. Cl.$^5$ ............................ H01L 21/44
[52] U.S. Cl. ..................... 437/190; 437/192; 437/203; 148/DIG. 20
[58] Field of Search ............. 437/190, 195, 192, 194, 437/203, 919

[56] References Cited

U.S. PATENT DOCUMENTS

| 4,833,519 | 5/1989 | Kawano et al. ............ 437/190 |
| 4,962,414 | 10/1990 | Liou et al. ................. 437/190 |
| 4,983,532 | 1/1991 | Mituni et al. .............. 437/203 |
| 5,057,447 | 10/1991 | Paterson ................... 437/919 |
| 5,066,612 | 11/1991 | Ohba et al. ............... 437/192 |
| 5,093,710 | 3/1992 | Higuchi .................... 437/195 |
| 5,098,860 | 3/1992 | Chakravorty et al. .... 437/195 |

FOREIGN PATENT DOCUMENTS

| 110862 | 5/1991 | Japan ..................... 437/919 |
| 150871 | 6/1991 | Japan ..................... 437/919 |
| 2143372 | 2/1985 | United Kingdom ..... 437/190 |

Primary Examiner—Brian E. Hearn
Assistant Examiner—Linda J. Fleck
Attorney, Agent, or Firm—Hill, Steadman & Simpson

[57] ABSTRACT

Described herein is a method for forming a barrier metal structure in a minute contact hole in such a way as to ensure good coverage by the metal.

The method of the invention comprises the steps of: opening a contact hole in an insulation film layer on a substrate in a diameter larger than an originally intended target value; forming a barrier metal layer over the entire surfaces of the insulation film layer; forming an oxidation film layer over the entire surfaces of the barrier metal layer until the diameter of the contact hole reaches the original target value; etching the oxidation film layer by anisotropic etching; and embedding a metal in the contact hole. Further, after forming a metal plug, the barrier metal layer may be selectively etched back in such a way as to leave a barrier metal layer only at the bottom of the contact hole.

2 Claims, 2 Drawing Sheets

FIG. I(A)
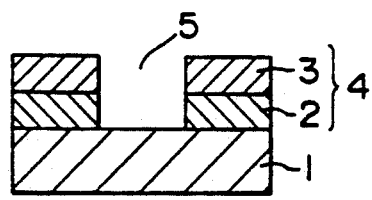
FIG. I(F)
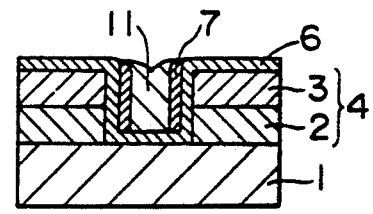
FIG. I(B)
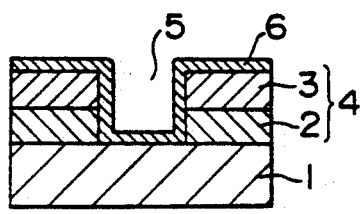
FIG. I(G)
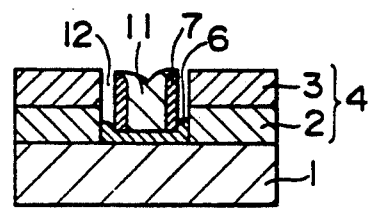
FIG. I(C)
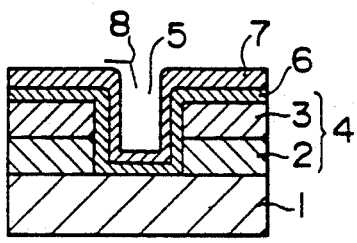
FIG. I(H)
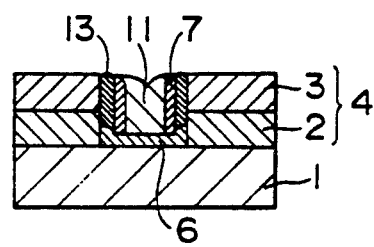
FIG. I(D)
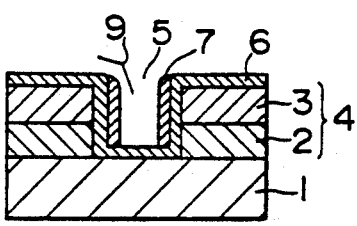
FIG. I(I)
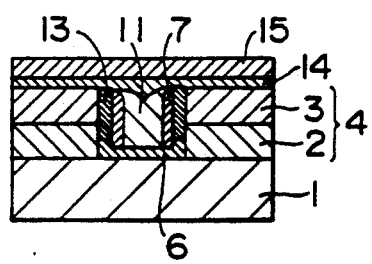
FIG. I(E)
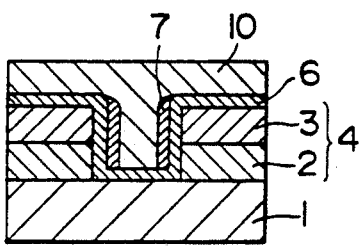
FIG. I(J)
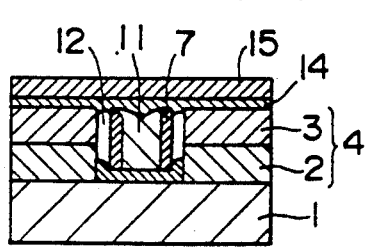

F I G. 2
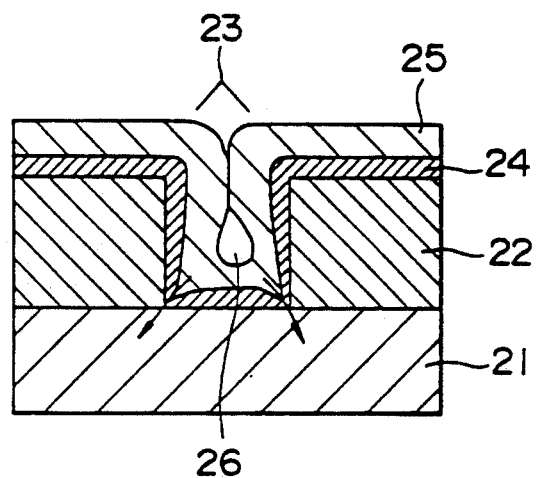

METHOD FOR FORMING BARRIER METAL STRUCTURE

BACKGROUND OF THE INVENTION

1. Field of the Art

This invention relates to a method for forming a barrier metal structure within a minute contact hole opened in an insulation film layer on a substrate of a semi-conductor device or the like.

2. Description of the Prior Art

As a basic construction of semi-conductor devices, it has been known in the art to open a contact hole in a layer insulation film on a semi-conductor substrate of silicon or the like and to embed a wiring metal in the contact hole.

The construction of this sort has a number of problems which jeopardize the reliability of the semi-conductor device itself, for example, destruction of junction between a wiring aluminum layer and a silicon substrate by alloy pits formed due to the reaction between them, or an abrupt increase of contact resistance between the wiring layer and the substrate due to precipitation of silicon grains on the surfaces of the contact hole.

Therefore, for the purpose of improving the reliability of semi-conductor devices, it has become a widely accepted practice to deposit a barrier metal layer of TiN, TiW or the like within the contact hole, for example, by a spattering process, thereby preventing the undesirable reactions between the substrate material like Si and the wiring material like aluminum According to conventional design rules for semi-conductor devices, it has been possible to secure a sufficient coverage when forming a barrier metal layer or a wiring layer in a contact hole.

However, along with the recent developments of very large size integration devices, the design rules in this field of the art have reached a level of extreme fineness. This trend toward fine technology is also found in contact holes to be formed in insulation layers on semi-conductor substrates.

A fine contact hole of this sort involves a number of problems in connection with the coverage of a barrier metal layer or a wiring metal layer, especially in connection with the coverage in peripheral portions at the bottom of the contact hole. More specifically, as shown in FIG. 2, in order to prevent the reaction between a wiring layer of aluminum and a substrate of Si, it has been the general practice to deposit a layer of a barrier metal such as TiN, TiW or the like or of a silicide such as $TiSi_x$ in and over a contact hole 23 opened in an insulation film layer 22 on the Si substrate 21, before forming a wiring layer 25 of aluminum thereon. However, there are possibilities of the wiring metal itself breaking through the barrier metal layer 24 and getting into the Si substrate 21 to cause a junction leak when the coverage of the barrier metal layer 24 is poor, or of a void 26 being formed in the wiring layer when the coverage of the wiring metal itself is poor, degrading the reliability of the semi-conductor device to a considerable degree.

SUMMARY OF THE INVENTION

The present invention contemplates to solve the above-mentioned problems of the prior art, and has as its object the provision of a method which permits to form a barrier metal structure within a fine contact hole with satisfactory coverage.

In accordance with the present invention, for achieving the above-stated objective, there is provided a method for forming a barrier metal structure in a contact hole, which comprises the steps of: opening an contact hole in an insulation film layer on a substrate in a diameter larger than an originally intended target value; forming a barrier metal layer over the entire surfaces of the insulation film layer; forming an oxidation film layer over the entire surfaces of the barrier metal layer until the diameter of the contact hole reaches the target value; etching the oxidation film layer by anisotropic etching; and embedding a metal in the contact hole.

In short, the method of forming a barrier metal structure according to the invention has a feature in that a barrier metal layer is formed on a contact hole which has a larger diameter than an originally indented value, and then an oxidation film is formed on the side walls of the contact hole in such a manner as to equalize the diameter of the contact hole with the original target value.

Further, according to the present invention, after forming a contact plug, the barrier metal layer may be selectively etched in such a way that the barrier metal layer remains only at the bottom of the contact plug, if desired.

According to the method of the invention, a barrier metal layer is formed over the entire surfaces of a contact hole which is opened in a larger diameter than an originally designed target value, for example, in a diameter which is large enough for accurate patterning. It follows that there can be formed a barrier metal layer with a satisfactory degree of coverage.

Succeedingly, an oxidation film is formed on the entire surfaces of the substrate, including surfaces of the side wall of the contact hole to diminish its diameter to the target value, and thereafter the oxidation film is etched back by anisotropic etching which retains the oxidation film on the side wall of the contact hole in unetched state, thereby permitting to provide a fine contact hole of the target diameter. This makes it possible to minimize the diameter of contact holes without resorting to a lithographic process.

The above and other objects, features and advantages of the invention will become apparent from the following description and the appended claims, taken in conjunction with the accompanying drawing which show by way of example some preferred embodiments of the invention.

BRIEF DESCRIPTION OF THE DRAWINGS

In the accompanying drawings:

FIGS. 1(a)-1(j) are diagrammatic illustration explanatory of a method of forming a barrier metal structure according to the invention; and FIG. 2 is a diagrammatic illustration of a barrier metal layer formed in and over a contact hole by a conventional method.

DESCRIPTION OF PREFERRED EMBODIMENTS

Hereafter, the invention is described more particularly by way of the embodiment shown in the accompanying drawings. However, it is to be understood that the invention is not restricted to the particular embodiments shown. In the drawings, similar component parts are designated by similar reference numerals.

Referring to FIG. 1, there is exemplified a case where a barrier metal structure is formed in a contact hole of 0.3 μm in diameter by a method according to the present invention.

More specifically, in this method, a contact hole 5 of 0.9 μm in diameter, a size which permits exposure by gamma rays, is opened by an ordinary method in an insulation film layer 4 which is provided on a substrate in the form of a silicon wafer and which consists of a flattening layer 2 of $SiO_2$ deposited by a TEOS-CVD process and a BPSG coated film 3. ((A) of FIG. 1)

Nextly, a barrier metal layer 6 of TiN is formed on the entire surfaces by a sputtering process, depositing the metal in a thickness of 0.1 μm on the side wall of the contact hole 5. ((B) of FIG. 1) In case of a contact hole 5 which is of a relatively large size like this one, the barrier metal layer 6 can be formed invariably in a sufficient degree even in peripheral portions of the bottom wall of the contact hole 5.

In the next place, an oxidation film 7 of good coverage, for example, an oxidation film 7 of $SiO_2$ is deposited in a thickness of 0.3 μn on the entire surfaces by a TEOS-CVD process, while permitting the oxidation film to deposit on the side wall of the contact hole 5 in a thickness of about 0.2 μm. ((C) of FIG. 1)

The $SiO_2$ oxidation film 7 deposited by a TEOS-CVD process has a tendency of rounding off the edge portion 8 around the entrance opening of the contact hole 5, imparting thereto a slight degree of taper. This tapered shape of the edge portion 8 contributes to improve the coverage of the contact hole by the wiring metal layer which will be formed thereon afterwards.

Nextly, the oxidation film layer 7 is etched back by ordinary anisotropic dry etching to a degree corresponding to the thickness of the oxidation film, namely, to a depth of 0.3 μm. ((D) of FIG. 1) At the time of this anisotropic etching, the oxidation film 7 on the side wall of the contact hole stands almost in an unetched state, so that the diameter of the contact hole remains unchanged, keeping the original target value of 0.3 μm. The substrate 1 which is covered with the barrier metal layer 6 has no possibility of being etched in this etch-back stage.

In the anisotropic etching, the peripheral portions around the entrance opening 9 of the contact hole 5 are etched in a greater degree, so that, as shown at (D) of FIG. 1, the entrance opening 9 is imparted with a smooth tapered shape which is suitable for improving the coverage of a metal which will be embedded in the contact hole afterwards.

Succeedingly, a metal for a wiring layer or for a contact plug is embedded in the contact hole 5, which has been formed with a barrier metal structure with a sufficient coverage for preventing protrusion of the metal layer into the substrate 1 as described above.

As for example of a metal to be anchored in the contact hole 5, there may be formed a blanket CVD tungsten layer 10 which has satisfactory property in coverage, as shown at (E) of FIG. 1.

The barrier metal structure which is formed in the above-described manner according to the method of the invention can take various forms in application. For example, a metal plug 11 as shown at (F) of FIG. 1 can be formed by etching back the tungsten layer 10 with a $C_2Cl_3F_3$ gas.

In case succeedingly the barrier metal layer 6 of TiN is selectively etched by replacing the etching gas with a mixture gas of $BCl_3$ and $Cl_2$, a gap 12 is formed around the oxidation film 7 on the side wall of the metal plug 11 as shown at (G) of FIG. 1. In this case, the barrier metal structure consists of a barrier metal layer 6 which exists only at the bottom of the metal plug 11.

Further, an insulating body 13 can be formed in the gap space 12 by coating a SOG layer on the barrier metal structure followed by etch-back, or alternatively by depositing polysilicon on the barrier metal structure following by oxidation and etch-back.

After forming the tungsten metal plug 11 on the barrier metal structure in this manner, a TiN layer 14 and a wiring aluminum layer 15 can be formed as shown at (I) of FIG. 1.

If desired, a TiN layer 14 and a wiring aluminum layer 15 may be formed without burying an insulating material in the gap space 12 as shown at (J) of FIG. 1.

Moreover, the above-described method of forming a contact hole according to the present invention can be suitably applied to the manufacturing processes not only of individual semi-conductor devices like MOS transistors but also of integrated circuits including very large scale integrated circuits.

The above-described method of the present invention makes it possible to improve the coverage of a barrier metal layer or a wiring layer to be formed in the contact hole, namely, to improve the barrier quality. Besides, the method of the invention can be easily applied to a conventional process which is simile, reliable and suitable for production on large scale, to obtain products with high reliability and feproducibility.

What is claimed is:

1. A method for forming a barrier metal structure in a contact hole, comprising the steps of:

opening a contact hole in an insulation film layer on a substrate in a diameter larger than an originally intended value;

forming a barrier metal layer over the entire surfaces of said insulation film layer;

forming an oxidation film layer over the entire surfaces of said barrier metal layer until the diameter of said contact hole reaches said target value;

etching said oxidation film layer by anisotropic etching; and embedding a metal in said contact hole.

2. A method as defined in claim 1, further comprising the step of selectively etching said barrier metal layer in such a manner as to leave a barrier metal layer only at the bottom of said contact hole.

* * * * *